United States Patent [19]

Norrgrann et al.

[11] Patent Number: 5,759,621

[45] Date of Patent: *Jun. 2, 1998

[54] BATCH LOADING SYSTEM FOR CVD

[75] Inventors: Tor Norrgrann, Huddinge; Kjell Palsson, Gimo; Björn Ljungberg, Enskede; Ingemar Hessman, Sandviken, all of Sweden

[73] Assignee: Sandvik AB, Sandviken, Sweden

[*] Notice: The term of this patent shall not extend beyond the expiration date of Pat. No. 5,576,058.

[21] Appl. No.: 703,966

[22] Filed: Aug. 28, 1996

Related U.S. Application Data

[63] Continuation of Ser. No. 405,782, Mar. 17, 1995, Pat. No. 5,576,058.

[30] Foreign Application Priority Data

Mar. 18, 1994 [SE] Sweden ................. 9400950

[51] Int. Cl.$^6$ ................. C23C 16/44
[52] U.S. Cl. ................. 427/248.1; 269/47; 269/296
[58] Field of Search ................. 427/248.1; 118/728, 118/500; 269/47, 52, 296, 309

[56] References Cited

U.S. PATENT DOCUMENTS

| | | | |
|---|---|---|---|
| 3,496,010 | 2/1970 | Bracken et al. | 117/66 |
| 3,964,937 | 6/1976 | Post et al. | 148/6.35 |
| 4,558,388 | 12/1985 | Graves, Jr. | 360/135 |
| 5,304,249 | 4/1994 | Chosa | 118/728 |
| 5,380,551 | 1/1995 | Blonder et al. | 427/166 |
| 5,393,349 | 2/1995 | Ohkase | 118/725 |
| 5,543,022 | 8/1996 | Nguyen et al. | 204/298.15 |
| 5,576,058 | 11/1996 | Norrgrann et al. | 427/248.1 |

FOREIGN PATENT DOCUMENTS

90/08613  8/1990  WIPO.

OTHER PUBLICATIONS

Patent Abstracts of Japan, vol. 12, No. 242 (C-510), abstrat of JP 63-33571, published 1988-02-13.

Primary Examiner—Shrive Beck
Assistant Examiner—Timothy Meeks
Attorney, Agent, or Firm—Burns, Doane, Swecker & Mathis, L.L.P.

[57] ABSTRACT

There is provided a method of coating cutting tool inserts by CVD methods with a completely covering coating. During the coating step, the inserts are resting in contact with the support in only a few tiny spots and sufficient space is allowed around each insert to ascertain optimum coating conditions. In a preferred embodiment, each insert rests on a peg allowing a rational production in larger scale and fully automatic CVD loading.

7 Claims, 4 Drawing Sheets

BATCH LOADING SYSTEM FOR CVD

This application is a continuation of application Ser. No. 08/405,782, filed Mar. 17, 1995, now U.S. Pat. No. 5,576,058.

BACKGROUND OF THE INVENTION

The present invention relates to a CVD batch loading method used in connection with coating of cutting inserts suitable for a rational production in larger scale allowing fully automatic CVD loading.

Chemical Vapor Deposition (CVD) of wear resistant coatings on cemented carbide inserts has been an industrial practice for more than 20 years. The CVD technique has extensively been discussed in the literature.

In order to minimize the production costs for coated inserts, large sized (10,000–15,000 inserts) CVD batches are generally used. Rational loading and unloading of the inserts from the CVD reactor is thus required. Transportation of the whole load or parts of the load must be possible to be carried out safely, particularly prior to the coating operation.

Another problem related to mass volume CVD is to find an appropriate loading arrangement of the inserts that will allow a well-controlled gas flow through the CVD reactor in order to ensure high and even coating quality throughout the whole load.

Yet another problem is to avoid contact marks on the inserts formed during the coating process in the zone between the inserts and their support. Contact marks on the inserts are not acceptable from a cosmetic point of view and also since they may deteriorate the cutting performance of the coated inserts.

There are many different batch loading systems or methods known in the art.

In one loading arrangement, the inserts are allowed to hang in slits in a tray. This method has the disadvantage of leaving contact marks on the clearance faces of the inserts. The system is unstable and there is always a potential risk during transportation that the inserts fall over and completely rearrange the packing. In addition, all surfaces of an insert with this type of loading will not be exposed to the same amount of gas flow during the coating process. This may result in serious variation in the coating thickness of any particular insert and hence the quality of the coating.

In another similar system, the inserts hang between rods. This system suffers from the same drawbacks as those mentioned above.

In the so-called net loading arrangement, the inserts are placed on woven metal nets. The load is built up by piling each metal net on top of each other. When using this method: a) the gas supply to the regions between the inserts and the metal net wire may be insufficient; b) care has to be taken during transportation to avoid that inserts slide together resulting in contact marks between individual inserts; and c) contact marks between the nets and the inserts are always formed.

In yet another method, the inserts are threaded up on a rod. Spacers between each insert are generally used to avoid contact between the inserts. The rods may be oriented horizontally or vertically in the CVD reactor. The main drawbacks of this method are the very complicated and time consuming loading and unloading procedures. Contact marks between the spacer and the insert are difficult to avoid. This method can be applied to inserts having a central hole for clamping.

In EP 454,686, a loading system is disclosed in which the inserts are stacked on top of each other on a central pin, possibly with a spacer between. As a result, the inserts will be only partially coated. This method is aimed for plasma CVD and will not be fully applicable to ordinary CVD since the inserts will be "glued" or grown together during an ordinary CVD process.

OBJECTS AND SUMMARY OF THE INVENTION

It is an object of this invention to avoid or alleviate the problems of the prior art.

It is further an object of this invention to provide a CVD batch loading method used in connection with coating of cutting inserts suitable for a rational production in larger scale allowing fully automatic CVD loading.

In an aspect of the invention there is provided a method of coating cutting tool inserts by CVD during which coating, the inserts are resting on a support wherein said support is a peg attached to a carrier, said peg comprising a foot portion and a shoulder portion.

DETAILED DESCRIPTION OF THE PREFERRED EMBODIMENTS OF THE INVENTION

The batch loading system according to the presently claimed invention utilizes a peg attached to a carrier. As a result of this method of stacking cutting tool inserts in a CVD reactor, complete and even coating coverage with minimal contact marks on the insert are obtained.

Figure 2:
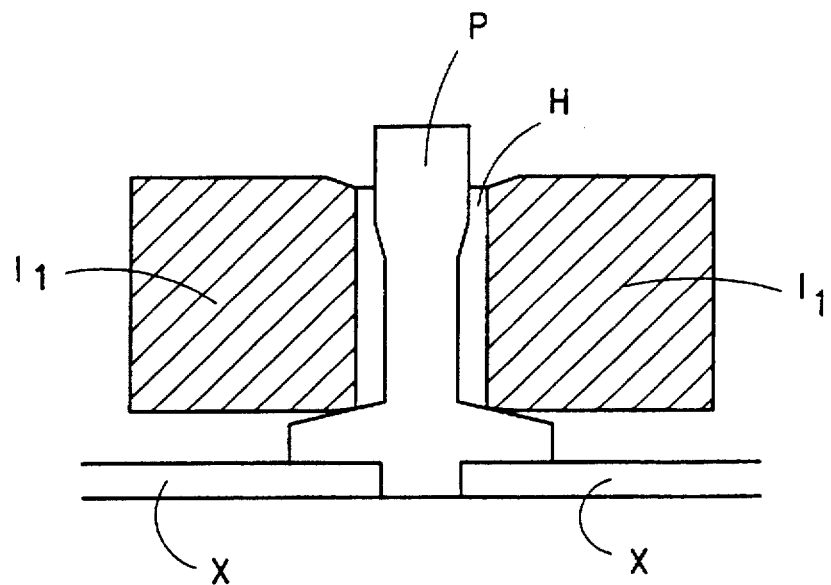
FIGS. 2–7 show various embodiments of the presently claimed invention in which P=peg, X=carrier, $I_1$=insert 1, $I_2$=insert 2, $I_3$=insert 3, $I_4$=insert 4, H=hole and F=depression.

According to the presently claimed invention, an insert $I_1$ with a central hole H for clamping, which generally is the case for inserts used for turning, is positioned on a peg P as shown in FIG. 2. The insert rests on the peg shoulder B having such a shape that there is minimal contact between the peg and the insert and preferably so that contact occurs at only a few tiny points. This can be done by altering the shape of the shoulder (e.g., circular, rectangular, square or in the form of wings) depending upon the shape of the hole H or the insert itself. Inside the hole H there is a wide passage around the neck to ensure even coating thickness of the inner walls of the hole H. (The dimension of the hole H is important for a safe fixing of the insert into its tool holder). The function of the head D which protrudes above the top surface of the insert $I_1$ is to serve as a support for the next carrier placed on top (not shown). In case the hole H is straight, the thicker head acts to prevent the insert from tilting from its horizontal position and touch the upper and/or the lower carrier surfaces. In some types of inserts, the hole H is wider at the top surface of the insert and, in that case, a peg without a head can be used. The peg P is attached to the carrier X.

Figure 3:
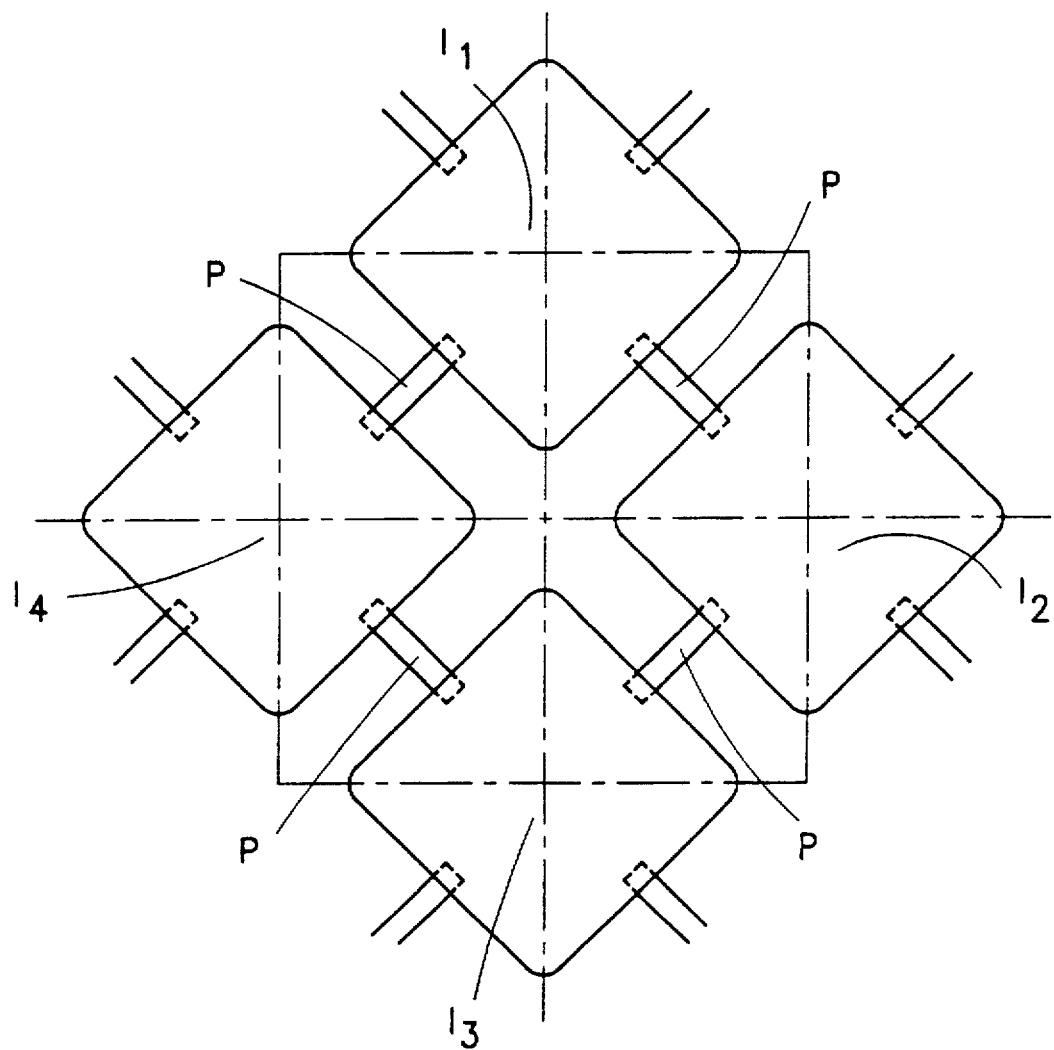

For inserts without a central hole, a loading arrangement according to the presently claimed invention is illustrated in FIG. 3 for square inserts $I_1$, $I_2$, $I_3$ and $I_4$ in which the pegs P are placed between the inserts and generally support at least two inserts. The peg shoulder B shall have such a shape, e.g., a sharp edge or tip, that the contact area is minimized.

Figure 1:
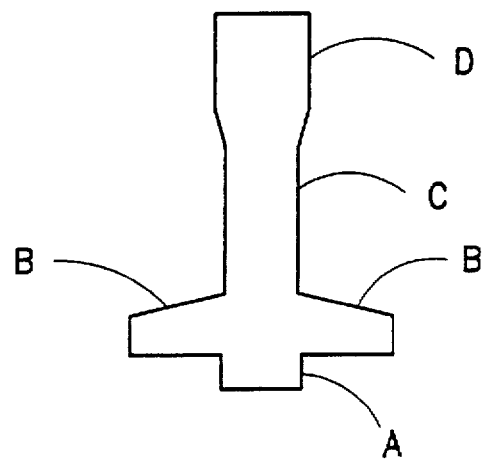
FIG. 1 shows an example of a peg P used in the presently claimed invention in side view. The peg P consists of a foot A and shoulders B and a neck C and a head D. The shoulders B have a circular as well as non-circular cross-section such as square, triangular or rectangular but can also be in the form of wings. The foot A is preferably circular.
Figure 4:
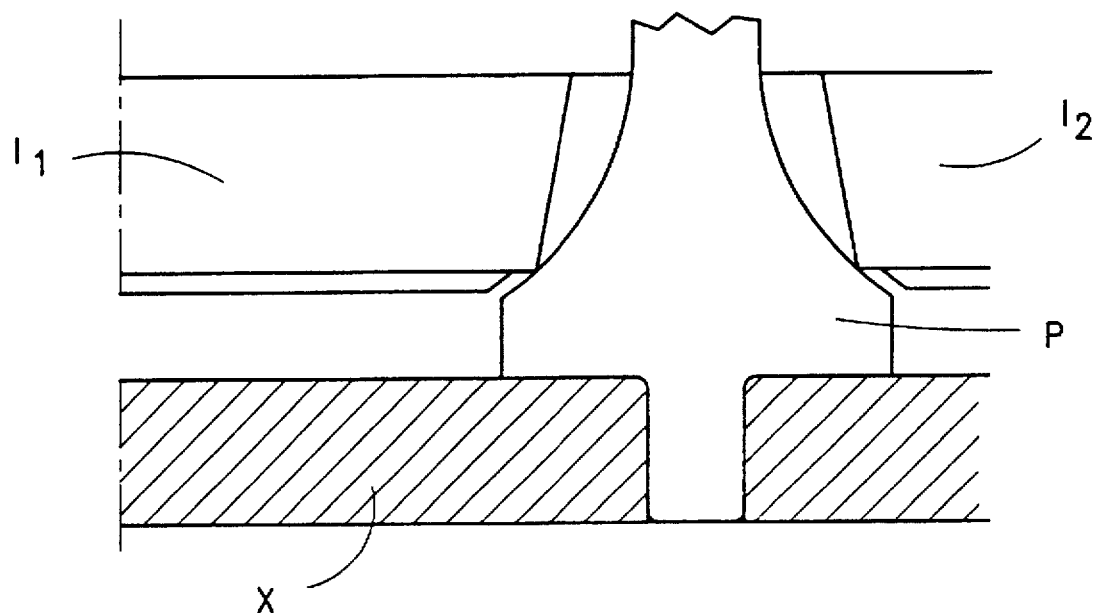

In one embodiment, a peg P similar to FIG. 1 is used as shown in FIG. 4 in which the peg supports an insert only at the middle of the edge. This arrangement is preferably used for single sided inserts.

Figure 5:
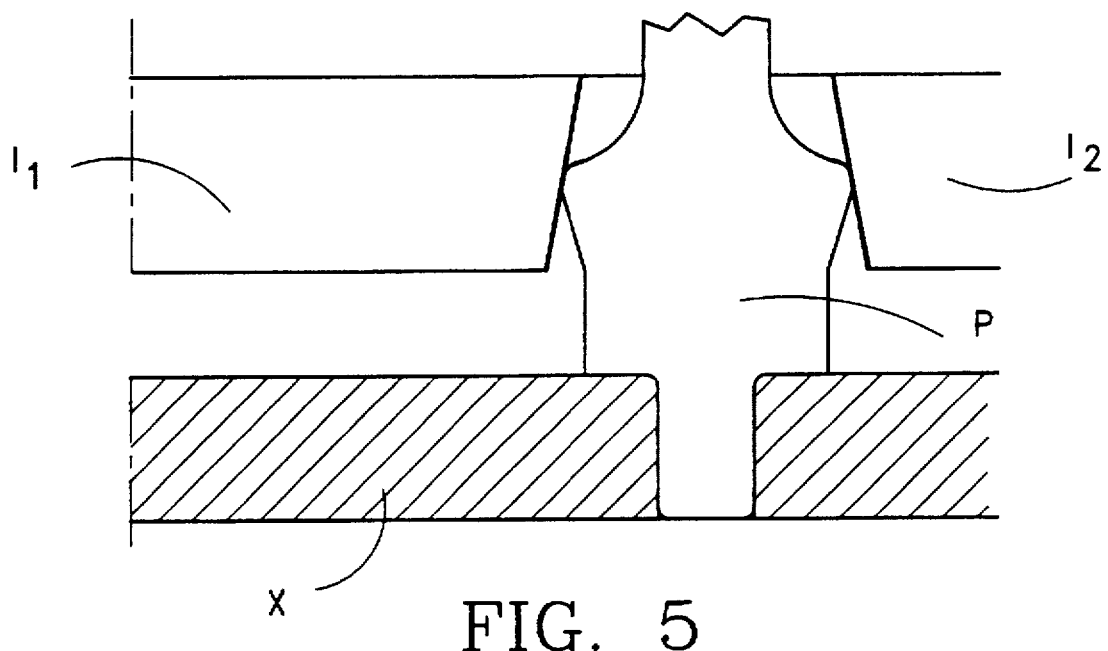

In an alternative embodiment which can be used for positive inserts, a peg shown in FIG. 4 is used. In this case, the peg supports an insert essentially in the middle of each clearance face (FIG. 5).

Figure 6:
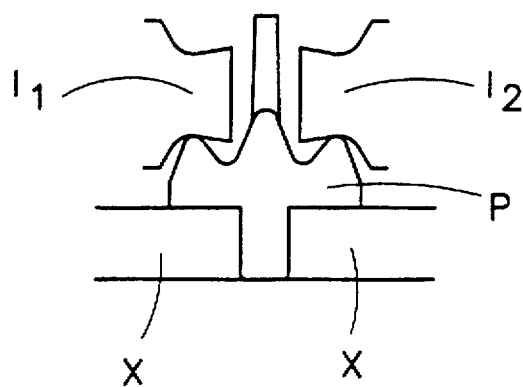

In yet another alternative embodiment for inserts with a chipbreaker, a peg P as shown in FIG. 6 is used. In this case, the peg P supports the inserts $I_1$ and $I_2$ essentially in the bottom of the chipbreaker of each insert. The chipbreaker has to be deep enough so as to ensure maximum stability of the loading arrangement. Alternatively, planar inserts can be provided with a depression between the corners to receive the shoulder of the pegs.

Figure 7:
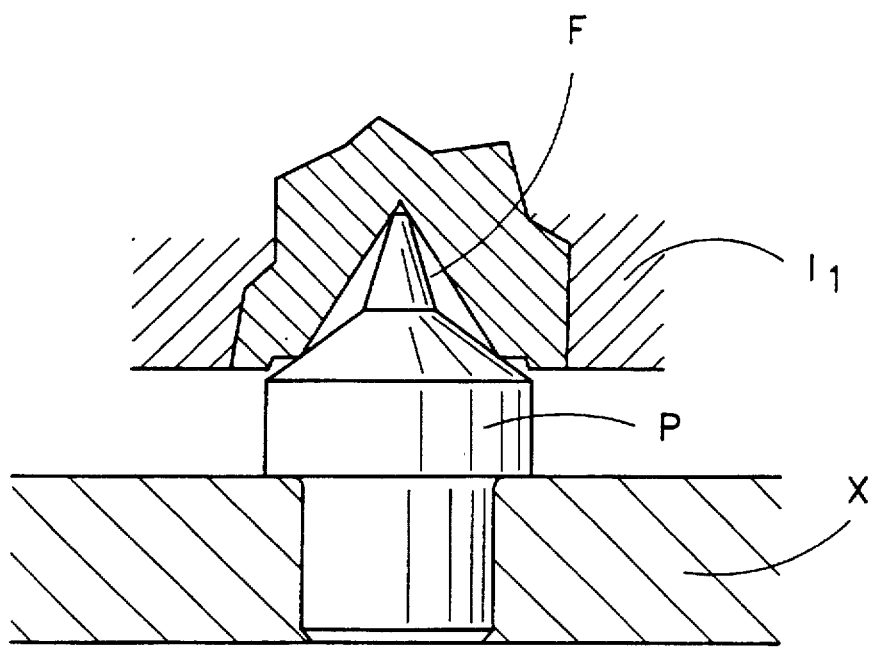

In the various embodiments above, the pegs serve also as support of a following carrier. In case such support is provided in other ways, the neck (C) and head (D) can be excluded. In such case, an alternative embodiment according to FIG. 7 can be used. In this embodiment, insert $I_1$ is provided with a central hole H (not shown) or depression F of a suitable depth and shape adapted to the peg P.

These embodiments are given as example only. Other embodiments are, of course, possible within the gist of the invention.

Pegs according to the presently claimed invention can be made of a refractory material such as ceramics, reinforced graphite, molybdenum but are preferably formed of a conventional cemented carbide.

The carrier X may be a woven metal net of, e.g., iron alloy with a suitable mesh size or a tray of graphite or other refractory material with mounting holes drilled for the pegs.

The peg foot is snapped into the metal net or pressed into the mounting holes in the tray. A desired number of pegs are mounted in each carrier in a regular pattern. The distance between the pegs as well as the height of the pegs is selected to give a desired free gas volume around each insert. A free volume around each insert of 1–5 mm is generally suitable. The carriers are piled on top of each other (preferably resting on the peg heads) to complete a full CVD load.

When using a tray carrier and a vertical gas flow, holes are suitably drilled in the trays in the areas between the pegs. The size and positioning of these holes can be optimized in accordance with known techniques so that the gas flow can be controlled and directed in almost any desired way throughout the pile of trays.

When using horizontal or radial gas flows, e.g., when employing the MTCVD (Moderate Temperature CVD) technique, the holes in the trays can optionally be omitted.

The loading system of the presently claimed invention allows the process gases to reach all essential surfaces of the inserts improving the coating thickness distribution, minimizing discoloration due to irregular gas flow pattern and reducing coating time. The rigid and exact positioning of the inserts allows a safe transportation prior to and after the coating step and also allows an automatic loading system. By using a suitable cross-section of the shoulders, the only contact between the peg and the insert will occur at only a few, less than five, tiny points which are not critical for the performance of the coated inserts.

In the foregoing description only very few specific details have been given by way of examples only. The reason hereto is that the exact conditions depend to a certain extent on the design of the equipment and the deposition conditions used. It is within the purview of the skilled artisan to adapt the method of the present invention with regard to the design and deposition conditions of his equipment.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of coating cutting tool inserts comprising:
   supporting the inserts on a support wherein said support includes a peg received in mounting holes of a carrier, said peg comprising a foot portion and a shoulder portion wherein the peg is placed between two inserts; and
   coating the inserts by CVD.

2. The method of claim 1 wherein the inserts include a chipbreaker and the chipbreaker rests on the shoulder portion of the peg.

3. The method of claim 1 wherein the inserts rest on shoulders of a plurality of pegs essentially in the middle of a clearance face of the inserts.

4. The method of claim 1 wherein the inserts rest on shoulders of a plurality of pegs in the middle of an edge of the inserts.

5. A method of coating cutting tool inserts comprising:
   supporting the inserts on a support, wherein the inserts include a top surface, a bottom surface, and at least one depression on the bottom surface, wherein said support includes a plurality of pegs attached to a carrier, and said pegs are received in said depressions to support the inserts during coating; and
   coating the inserts by CVD.

6. The method of claim 5, wherein said at least one depression is arranged between adjacent corners.

7. The method of claim 5, wherein said at least one depression is arranged centrally.

* * * * *